United States Patent
Michels et al.

(10) Patent No.: US 10,514,312 B2
(45) Date of Patent: Dec. 24, 2019

(54) HYDRAULIC PRESSURE SENSOR FOR A VEHICLE

(71) Applicant: Lucas Automotive GmbH, Koblenz (DE)

(72) Inventors: Sven Michels, Lutzerath (DE); Thomas Baron, Leimbach (DE); Karlheinz Schaust, Fachbach (DE)

(73) Assignee: Lucas Automotive GmbH, Koblenz (DE)

( * ) Notice: Subject to any disclaimer, the term of this patent is extended or adjusted under 35 U.S.C. 154(b) by 171 days.

(21) Appl. No.: 15/551,407

(22) PCT Filed: Jan. 18, 2016

(86) PCT No.: PCT/EP2016/050886
§ 371 (c)(1),
(2) Date: Aug. 16, 2017

(87) PCT Pub. No.: WO2016/131582
PCT Pub. Date: Aug. 25, 2016

(65) Prior Publication Data
US 2018/0017457 A1    Jan. 18, 2018

(30) Foreign Application Priority Data
Feb. 16, 2015  (DE) ................ 10 2015 001 988

(51) Int. Cl.
*B60T 17/22* (2006.01)
*G01L 9/02* (2006.01)
(Continued)

(52) U.S. Cl.
CPC .............. *G01L 9/06* (2013.01); *B60T 8/171* (2013.01); *B60T 17/22* (2013.01); *G01L 9/0055* (2013.01)

(58) Field of Classification Search
CPC ...... B60T 17/22; B60T 8/171; G01L 9/00–08; G01L 9/0055; G01L 19/00; G01L 19/003;
(Continued)

(56) References Cited

U.S. PATENT DOCUMENTS

| 5,866,822 A | 2/1999 | Willig |
| 6,523,399 B2 | 2/2003 | Fritzsche et al. |

(Continued)

FOREIGN PATENT DOCUMENTS

| DE | 19521832 A1 | 12/1996 |
| DE | 10122330 A1 | 2/2002 |

(Continued)

*Primary Examiner* — Nguyen Q. Ha
(74) *Attorney, Agent, or Firm* — MacMillan, Sobanski & Todd, LLC

(57) ABSTRACT

A hydraulic pressure sensor for a vehicle comprises a sensor housing which comprises a fluid chamber, a sensor element for detecting the pressure of a fluid in the fluid chamber, and an electronic signal processing component which is electrically connected to the sensor element, for processing an electric signal characterizing the fluid pressure. Electrically conductive contacts for forwarding the electric signals processed by the electronic signal processing components are formed on an external main surface of the sensor housing.

19 Claims, 6 Drawing Sheets

(51) Int. Cl.
*G01L 19/00* (2006.01)
*G01L 19/14* (2006.01)
*G01L 9/06* (2006.01)
*G01L 9/00* (2006.01)
*B60T 8/171* (2006.01)

(58) Field of Classification Search
CPC ..... G01L 19/14; G01L 19/147; G01L 19/148; H01L 2224/48091; H01L 2224/73265
See application file for complete search history.

(56) References Cited

U.S. PATENT DOCUMENTS

| | | | |
|---|---|---|---|
| 6,799,812 B2 | 10/2004 | Risch et al. | |
| 6,955,087 B2* | 10/2005 | Perini | G01L 9/0002 338/4 |
| 7,231,830 B2* | 6/2007 | Otsuka | G01L 19/0084 73/756 |
| 7,992,445 B2* | 8/2011 | Kobayashi | G01L 9/0075 73/718 |
| 2001/0024865 A1 | 9/2001 | Kretschmann et al. | |
| 2005/0103111 A1* | 5/2005 | Imai | G01L 9/0055 73/715 |
| 2014/0137653 A1 | 5/2014 | Chiou et al. | |

FOREIGN PATENT DOCUMENTS

| | | |
|---|---|---|
| DE | 102004019428 A1 | 8/2005 |
| DE | 102004029084 A1 | 1/2006 |
| DE | 102005038822 A1 | 2/2007 |
| WO | 0011376 A2 | 3/2000 |
| WO | 0123855 A2 | 4/2001 |

* cited by examiner

HYDRAULIC PRESSURE SENSOR FOR A VEHICLE

CROSS-REFERENCE TO RELATED APPLICATIONS

This application is the National Phase of International Application PCT/EP2016/050886 filed Jan. 18, 2016 which designated the U.S. and that International Application was published on Aug. 25, 2016 as International Publication Number WO 2016/131582 A1. PCT/EP2016/050886 claims priority to German Patent Application No. 10 2015 001 988.0, filed Feb. 16, 2015. Thus, the subject nonprovisional application claims priority to German Patent Application No. 10 2015 001 988.0, filed Feb. 16, 2015. The disclosures of both applications are incorporated herein by reference.

BACKGROUND OF THE INVENTION

The present disclosure relates to a hydraulic pressure sensor for a vehicle, comprising a sensor housing, which has a fluid chamber, a sensor element for sensing the pressure of a fluid in the fluid chamber, and an electronic signal processing component, which is electrically connected to the sensor element and is intended for processing an electrical signal characteristic of the fluid pressure.

Hydraulic pressure sensors are used in many areas. Thus, for example, in the case of a hydraulic vehicle brake, an electronic control unit (ECU) activates a wide variety of components such as valves on the basis of the pressure in the fluid channels that is measured by the pressure sensor. The hydraulic pressure sensor is often a component part of a hydraulic control unit (HCU). It is of advantage in this respect if the interface between the pressure sensor and the ECU or between the HCU and the ECU can be designed as flexibly as possible, and the entire unit consisting of the HCU and the ECU has an overall height that is as small as possible.

Pressure sensors for measuring the fluid pressure often have a piezo-resistive element, the resistance of which changes when it undergoes deformation and is part of a resistance measuring bridge. A voltage difference between voltage dividers of the resistance measuring bridge is then a measure of the fluid pressure. The electrical signal representative of the fluid pressure, such as for example the voltage difference in the case of the resistance measuring bridge, is then usually passed on for further processing to an electronic signal processing component, such as for example an ASIC, and the further-processed signal is fed to the electronic control unit. It is of advantage in this respect if the interface between the pressure sensor and the electronic signal processing component, and also the interface between the electronic signal processing component and the ECU, can also be designed as flexibly as possible and has as little adverse effect as possible on the overall height of the unit consisting of the HCU and the ECU.

It is known to arrange and contact the electronic signal processing component on a separate printed circuit board. However, the possibility of limiting the height of the unit consisting of the HCU and the ECU is restricted by the signal processing component arranged and contacted on the separate printed circuit board because the printed circuit board with the electronic signal processing component projects beyond the hydraulic control unit and, as a result, the distance between the electronic control unit and the hydraulic control unit or the pressure sensor is limited to a minimum possible distance. The provision of an additional printed circuit board also entails additional costs.

US 2014/0137653 A1 discloses a pressure sensor, which has a plastic housing with a recess formed therein. Provided in the recess is a pressure transducer. Provided in the housing of the pressure transducer is a diaphragm, which adjoins a chamber that is formed in the housing of the pressure transducer and is in turn in fluid connection with an opening on the bottom of the recess of the plastic housing. Also arranged on the bottom of the recess of the plastic housing is a signal processing component, which is connected to the sensor element by means of connection wires. The signal processing component is in turn electrically connected by means of connection wires to conductive strips, which are attached to the bottom of the recess and extend through the plastic housing parallel to the bottom of the recess.

DE 10 2004 019 428 A1 discloses a semiconductor device which has a sensor chip with a pressure sensor. The sensor chip is embedded together with a device component that has an evaluation circuit in a covering of rubber-elastic material. External pressure fluctuations are transferred by way of the covering to the sensor chip 20, which detects them and passes them on to the device component by way of a wiring. Both the sensor chip and the device component are arranged on a wiring board with a wiring structure, and are connected to this wiring structure by way of bonding wires.

WO 01/23855 A2 discloses a pressure sensor device with a housing that is formed by a first housing part and a second housing part. The second housing part receives plug contacts, which are connected to a sensor element by way of electrical leads. The sensor element and the electrical leads are arranged in a cavity formed by the first and second housing parts. The sensor element comprises signal evaluation electronics, which transform the measuring signal into an output signal of the pressure sensor device, which can be picked up at the plug contacts.

SUMMARY OF THE INVENTION

The aim is therefore to provide a hydraulic pressure sensor for a vehicle that avoids one or more of the disadvantages of the prior art.

The hydraulic pressure sensor has the features of claim 1.

According to one aspect, the hydraulic pressure sensor for a vehicle comprises a sensor housing, which has a fluid chamber, a sensor element for sensing the pressure of a fluid in the fluid chamber, and an electronic signal processing component, which is electrically connected to the sensor element and is intended for processing an electrical signal characteristic of the fluid pressure. Electrically conducting contacts for passing on the electrical signal processed by the electronic signal processing component are formed on an outer main area of the sensor housing.

The electronic signal processing component is typically an ASIC. The electrically conducting contacts may be formed as contact pads. They may for example be formed from nickel with a layer of gold formed on them. The layer of gold may serve as protection from corrosion.

In one embodiment, the electronic signal processing component is arranged on the outer main area of the sensor housing on which the electrically conducting contacts are formed. The electronic signal processing component is therefore arranged on the same outer main area of the sensor housing on which the electrically conducting contacts are also formed. It may for example be fastened on the housing by means of an adhesive.

The arrangement described provides a particularly simple and compact configuration. The electronic signal processing component can be connected to the electrically conducting contacts for passing on the electrical signal processed by the electronic signal processing component by means of bonding wires and electrical conductor tracks that are formed on the outer main area. The electronic signal processing component and the regions adjoining it in which the bonding wires are located may be covered by a hardcoat and/or a gelcoat. The hardcoat serves as a protective layer.

In a further embodiment, the sensor element is arranged lying between the electronic signal processing component and the fluid chamber formed in the sensor housing. In this arrangement, the electronic signal processing component is located over the sensor element and protects it.

In a development, the sensor housing has a fluidic connection area for fluidically connecting the fluid chamber formed in the sensor housing to a fluid channel of a hydraulic control unit. The pressure sensor can thus measure the fluid pressure of the fluid in the fluid channel of the hydraulic control unit.

In another configuration, the outer main area of the sensor housing on which the electrically conducting contacts are formed is arranged opposite the fluidic connection area of the sensor housing. The electrically conducting contacts are then preferably also arranged parallel to the printed circuit board of an electronic control unit (ECU), to which the signals of the electronic signal processing component are to be passed on. The contact elements that establish the contact between the printed circuit board and the electrically conducting contacts on the sensor housing may be realized by contacts springs arranged in a housing. The housing with the contact springs may then be fastened on the sensor housing, for example by means of a snap connection, in such a way that the contact springs at one end contact the electrically conducting contacts on the sensor housing.

In another configuration, the outer main area of the sensor housing on which the electrically conducting contacts are formed is arranged alongside the fluidic connection area of the sensor housing. In the case of this configuration, the electrically conducting contacts are then substantially arranged at right angles to the printed circuit board of an electronic control unit (ECU), to which the signals of the electronic signal processing component are to be passed on. As a result, the contacting is possible by means of simple contact springs which extend at right angles to the printed circuit board of the ECU and parallel to the electrically conducting contacts on the sensor housing.

In the case of the configuration described above, the fluid chamber may be formed by a feed hole which is open to the fluidic connection area and opens out into a cross hole, the cross hole being sealed off from the outside by a plug. In one variant, a fluid chamber which is open to the feed hole and is sealed off from the outside, and to which the sensor element can be connected for measuring the pressure, then remains in the cross hole.

According to one embodiment, a connector by means of which the sensor housing can be fastened on a hydraulic control unit by clinching is provided on the fluidic connection area. The connector may be screwed onto the sensor housing. The clinch-fastening produces a sealed, pressure-resistant fitting of the sensor up to 200 bar. Since the electronic control unit is integrated in the hydraulic pressure sensor, the mounting of the pressure sensor on another component (such as the HCU) is simplified.

According to yet another configuration, the sensor element has an element which adjoins the fluid chamber and is deformable under fluid pressure and a pressure-dependent resistance element, which is provided on the element that can be deformed under fluid pressure on the side of the element that is facing away from the fluid chamber. The pressure-dependent resistance element is typically a diaphragm which adjoins the fluid chamber and is fastened in the chamber, for example by clamping. The sensor element may be a resistance measuring bridge, for example a Wheatstone measuring bridge, which has at least one strain gage as a pressure-dependent resistance element. The difference in voltage between the voltage dividers of the measuring bridge, known as the transverse bridge voltage, is then a measure of the deformation of the diaphragm, and consequently of the fluid pressure.

The pressure sensor described above may be a component part of a hydraulic control unit, while the hydraulic control unit may in turn be a component part of a vehicle braking system.

The hydraulic control unit with the pressure sensor may form a subassembly together with an electronic control unit (ECU). The configuration described above of the electrically conducting contacts on the sensor housing, and not on a separate printed circuit board, allows the subassembly to be made particularly compact.

Various aspects of this invention will become apparent to those skilled in the art from the following detailed description of the preferred embodiment, when read in light of the accompanying drawings.

BRIEF DESCRIPTION OF THE DRAWINGS

FIG. 1b schematically shows in a plan view the pressure sensor that is shown in FIG. 1a;

FIG. 5b schematically shows a sectioned side view along the line A-A in FIG. 5a of the pressure sensor that is shown in FIG. 5a;

DETAILED DESCRIPTION OF THE PREFERRED EMBODIMENTS

The exemplary embodiments described below provide a hydraulic pressure sensor for a motor vehicle of which the interface with respect to the ECU can be flexibly designed, which can be realized at low cost and which can be connected in an easy way to a hydraulic control unit to form a compact subassembly.

Figure 1A:
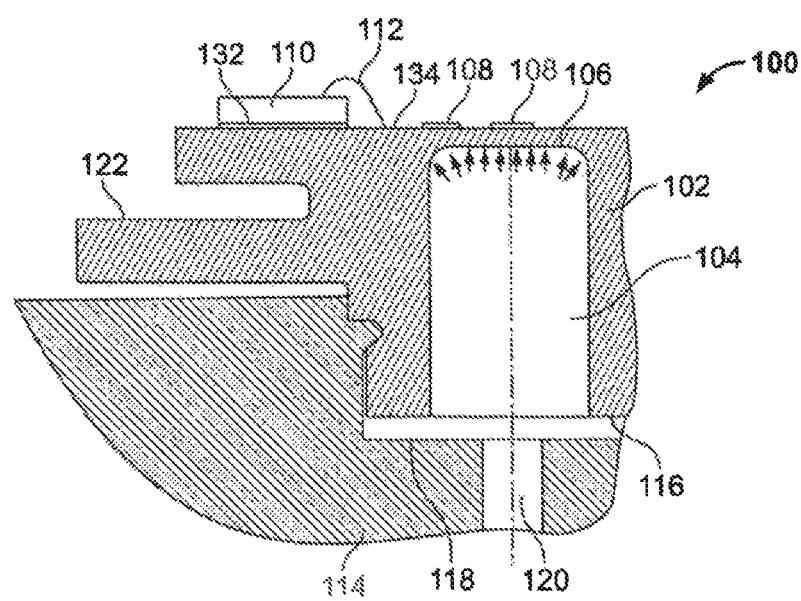
FIG. 1a schematically shows in a sectioned side view a first embodiment of a hydraulic pressure sensor, which is fastened on a hydraulic control unit.

FIG. 1a schematically shows in a sectioned side view a first embodiment of a hydraulic pressure sensor 100. The hydraulic pressure sensor 100 has a sensor housing 102, in which a fluid chamber 104 is formed. The fluid chamber 104 serves for receiving a liquid, virtually incompressible medium, such as for example brake fluid in the case of a vehicle braking system. The fluid chamber 104 is adjoined by a diaphragm 106, which forms an element that is deformable under fluid pressure. Arranged on the upper side of the diaphragm 106 with respect to FIG. 1a, i.e. on the side of the diaphragm 106 that is facing away from the fluid chamber 104, is a sensor element 108. Also arranged on the sensor housing 102 is an electronic signal processing component 110, which is electrically connected to the sensor element 108. In the exemplary embodiment shown here, the sensor element 108 is connected to the electronic signal processing component 110 by means of bonding wires 112.

In the example shown here, the hydraulic pressure sensor 100 is fastened on a hydraulic control unit 114 (HCU). The sensor housing 102 has for this purpose a fluidic connection area 116, on which the fluid chamber 104 is openly formed. The hydraulic control unit 114 likewise has a fluidic connection area 118, on which a fluid channel 120 formed in the HCU 114 is openly formed. The sensor housing 102 is fastened on the HCU 114 in such a way that the fluid chamber 104 is in fluidic connection with the fluid channel 120 of the HCU 114.

In the example shown here, the sensor housing 102 is fastened on the hydraulic control unit 114 by clinching. For this purpose, the sensor housing 102 has a flat-formed bearing area 122, onto which the pressure for clinching can be exerted. This produces a sealed, pressure-resistant fitting of the sensor housing 102 on the HCU 114, for example up to 200 bar. The sensor housing 102 may however also be fastened on the hydraulic control unit 114 in some other way.

The sensor element 108 has at least one resistance element, the resistance of which changes when it undergoes deformation. The pressure-dependent resistance element may be for example a strain gage. The sensor element may have a resistance measuring bridge, which serves the purpose of converting the deformation of the diaphragm 106 by the fluid pressure into a voltage signal dependent on the magnitude of the deformation. The resistance measuring bridge usually has two parallel-connected voltage dividers, each with two series-connected resistance elements.

What is known as the transverse bridge voltage is then a measure of the deformation of the diaphragm on which the resistance measuring bridge is arranged. The transverse bridge voltage indicates the difference in voltage between the voltage dividers of the resistance measuring bridge.

The resistance measuring bridge may be formed as a full bridge, in which the four resistance elements are formed as strain gages. The resistance measuring bridge may however also be configured differently, for example as a half-bridge with two strain gages.

Figure 1B:
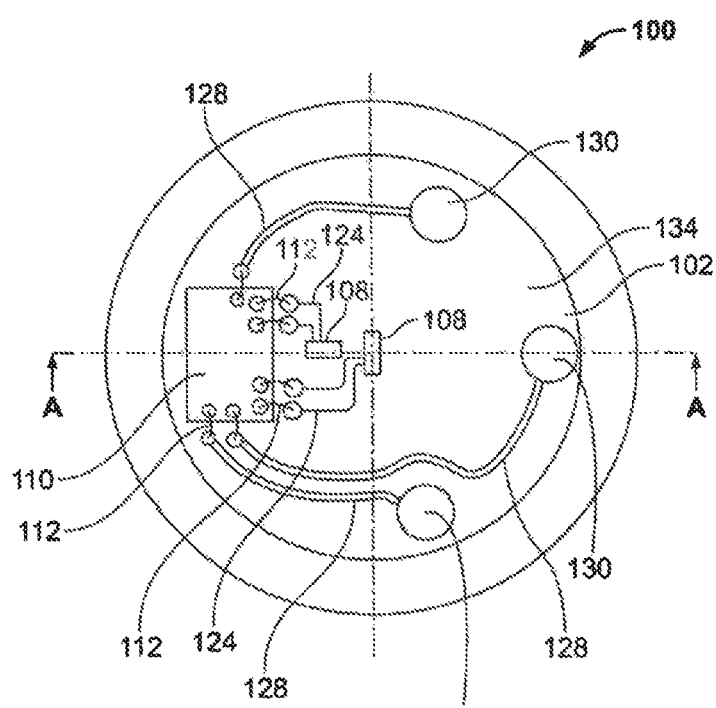

FIG. 1b shows the hydraulic pressure sensor 100 of FIG. 1a in a plan view. The sensor element 108 is connected to the electronic signal processing component 110 by way of first electrical conductor tracks 124 formed on the sensor housing 102 and bonding wires 112. In the exemplary embodiment shown here, the sensor element 108 consists of two elements, in order to sense the deformation of the diaphragm 106 in two different directions that are perpendicular to one another. The electronic signal processing component 110 is typically an ASIC. The electronic signal processing component 110 is in turn connected by means of bonding wires 112 to second electrical conductor tracks 128, which are formed on the sensor housing 102. The second electrical conductor tracks 128 are connected to electrically conducting contacts 130 formed on the sensor housing 102. The electrically conducting contacts 130 are formed here as contact pads. They serve for example for the contacting of the electronic signal processing component 110 with an electronic control unit (ECU) not shown here.

The electronic signal processing component 110 may be fastened on the sensor housing 102 by means of an adhesive 132 (see FIG. 1a).

The electronic signal processing component 110 and the regions adjoining it in which the bonding wires 112 are located may be covered by a hardcoat such as a gelcoat. The hardcoat serves as a protective layer. It seals against moisture and protects from pressure damage.

The electrically conducting contacts 130 may consist of nickel, covered by a layer of gold. The layer of gold may serve for corrosion protection.

In the exemplary embodiment shown in FIG. 1a and FIG. 1b, the electronic signal processing component 110 is arranged alongside the electrically conducting contacts 130 on an outer area 134 of the sensor housing 102. The outer area 134 is part of the outer surface of the sensor housing 102. It forms a main area of the sensor housing 102, which is arranged opposite the fluidic connection area 116 of the sensor housing 102.

As can also be seen in FIG. 1b, the sensor housing 102 has a circular cross-sectional area. The sensor housing 102 may, however, also have any other possible form.

Figure 2:
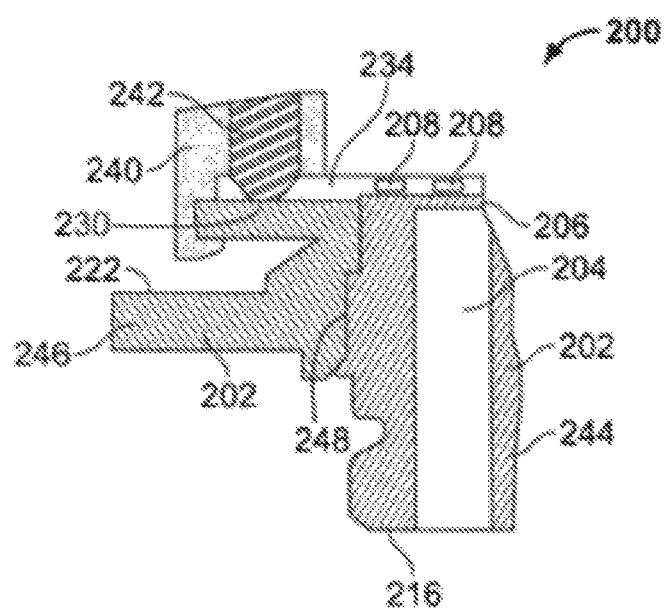
FIG. 2 schematically shows a first configuration of a sensor housing which is formed in two parts and the contact pads of which are contacted by means of a contact spring.

In FIG. 2, a configuration of the exemplary embodiment of a hydraulic pressure sensor 200 that is shown in FIGS. 1a and 1b for a vehicle is shown in a longitudinal section. Features corresponding to FIGS. 1a and 1b are provided with the same reference numerals, in each case increased by 100. The sensor housing 202 likewise has a fluid chamber 204, a diaphragm 206 adjoining the fluid chamber 204 and a sensor element 208 arranged on the diaphragm 206. Arranged alongside the sensor element 208 there is on an outer area 234 of the sensor housing 202 likewise an electronic signal processing component 210 (not shown here), which is electrically connected to the sensor element 208. The outer area 234 forms a main area which is arranged opposite the fluidic connection area 216.

In addition to the embodiment shown in FIGS. 1a and 1b, a housing 240 with a contact spring 242, which may serve for the contacting of the electronic control unit (ECU), is shown. The contact spring 242 contacts on the sensor housing 202 the electrically conducting contacts 230, which are electrically connected to the electronic signal processing component 210. The contact spring 242 is fastened by means of its housing 240 on the sensor housing 202 by means of a form fit. In the exemplary embodiment shown here, the housing 240 is fastened on the sensor housing 202 by means of a snap connection.

The housing 240 with the contact spring 242, as shown in FIG. 2, may also be used for the contacting of the electrically conducting contacts 130 that are shown in FIGS. 1 and 2.

The sensor housing 202 shown in FIG. 2 differs from the sensor housing 102 shown in FIGS. 1a and 1b in that the sensor housing 202 is formed in two parts. Specifically, the sensor housing 202 has a first part 244 and a second part 246, which are fixedly connected to one another, for example by means of a welded connection. The respective connecting areas 248 extend in the longitudinal direction of the sensor housing 202. The first part 244 comprises the fluid chamber 304, the diaphragm 206 and the sensor element 208 arranged on it. The second part 246 is arranged to the side of the first part 244 with respect to FIG. 3 and comprises the bearing area 222, onto which the pressure for clinching the sensor housing 202 to the HCU can be exerted. The second part 246 surrounds the first part 244 in the circumferential direction. Moreover, the housing 240 with the contact spring 242 is fastened on the second part 246 of the sensor housing 202.

Figure 3:
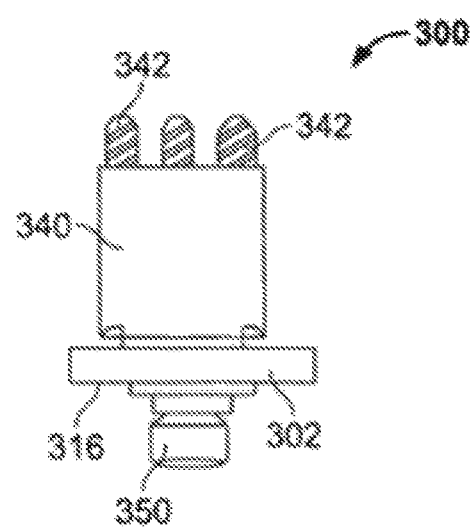
FIG. 3 schematically shows an embodiment of a hydraulic pressure sensor with contact springs arranged in a housing and a fluidic connector.

The housing 240 may have a number of contact springs 242 for the contacting of a number of electrically conducting contacts 230, as represented in FIG. 3. A number of housings, each with a contact spring, may also be provided.

FIG. 3 schematically shows a hydraulic pressure sensor 300, electrically conducting contacts of which are contacted with a number of contact springs 342, which are arranged in a housing 340. Features corresponding to FIGS. 1*a*, 1*b* and 2 are provided with the same reference numerals, in each case increased by 200 or 100. The hydraulic pressure sensor 300 has a sensor housing 302, on which the housing 340 with the number of contact springs 342 is fastened, for example by means of a snap connection. Moreover, the hydraulic pressure sensor 300 has on the fluidic connection area 316 a connector 350, by means of which the sensor housing 302 can be fastened on an HCU by clinching.

Figure 4:
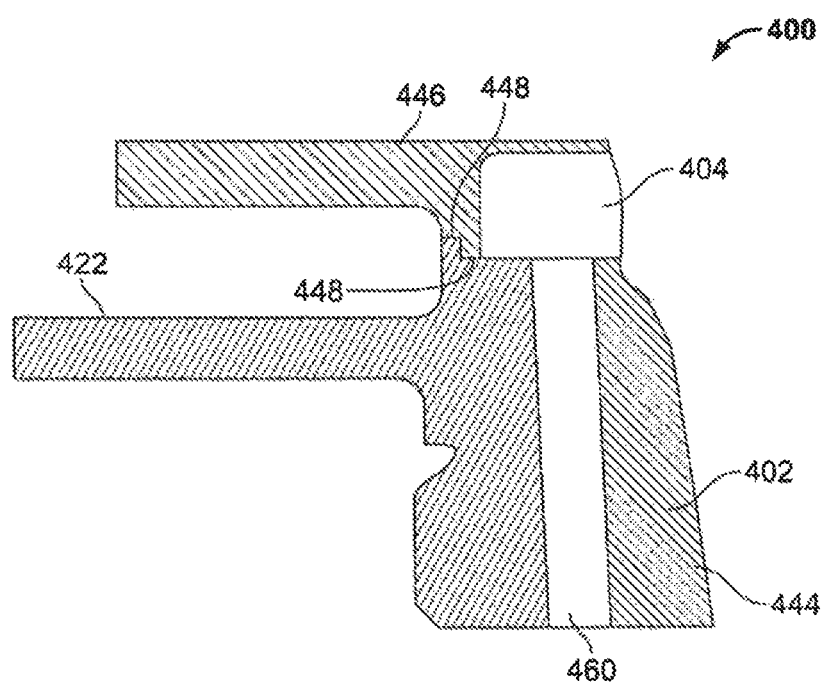
FIG. 4 schematically shows a second configuration of a two-part sensor housing.

FIG. 4 schematically shows in a longitudinal section a configuration as an alternative to FIG. 2 of a two-part sensor housing of a hydraulic pressure sensor. The features corresponding to FIGS. 1*a*, 1*b* and FIG. 2 are provided with the same reference numerals, in each case increased by 300 or 200. The two-part sensor housing 402 again has a first part 444 and a second part 446, each with a connecting area 448, the connecting areas 448 respectively extending in the transverse direction of the sensor housing 402.

The first part 444 and the second part 446 may be connected to one another by means of a welded connection. The first part 444 comprises the bearing area 442 for applying the pressure in order to fasten the hydraulic pressure sensor 400 on the HCU, and also a fluid channel 460, which opens out into the fluid chamber 404 formed in the second part 446. The second part 446 also comprises, though not represented in FIG. 4, the diaphragm adjoining the fluid chamber 404, the sensor element and the electronic signal processing component.

Figure 5A:
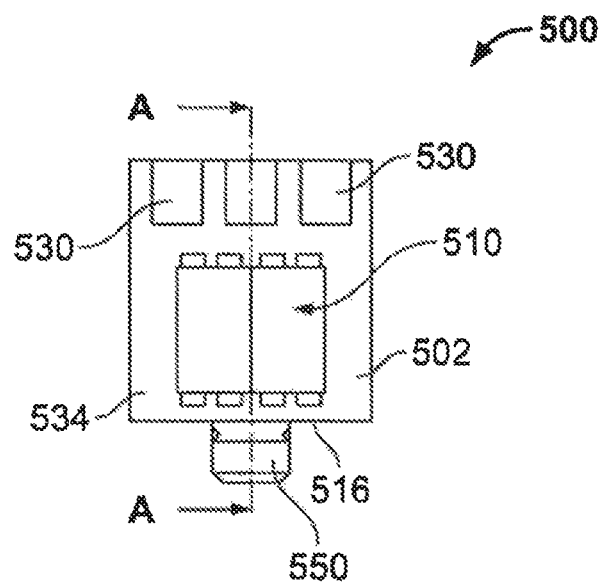
FIG. 5a schematically shows in a side view a second embodiment of a hydraulic pressure sensor in which the electronic signal processing component and the electrically conducting contacts are arranged on a side area.
Figure 5B:
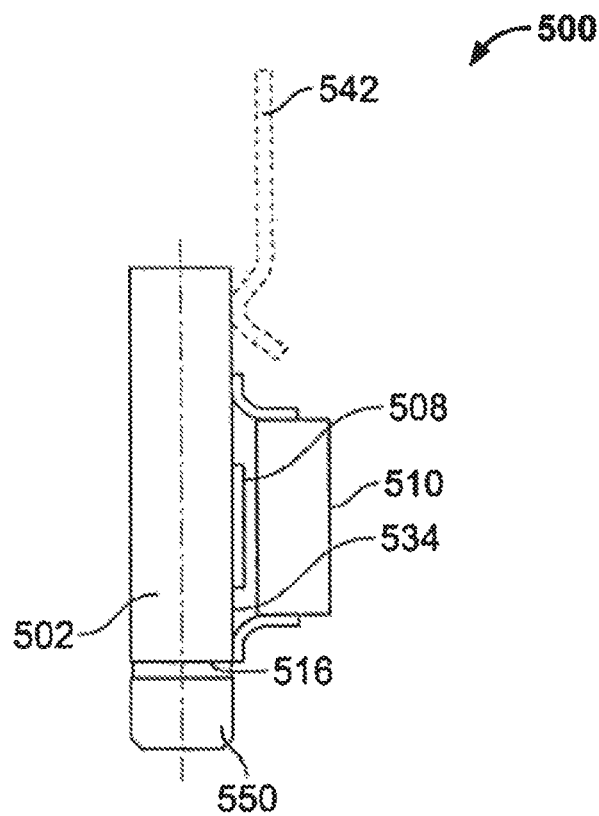

FIGS. 5*a* and 5*b* show a second exemplary embodiment of a hydraulic pressure sensor 500. Features corresponding to FIGS. 1*a* and 1*b* are provided with the same reference numerals, in each case increased by 400.

FIG. 5*a* shows a side view of the hydraulic pressure sensor 500. The hydraulic pressure sensor 500 differs from the pressure sensor 100 shown in FIGS. 1*a* and 1*b* in that the sensor housing 502 of this embodiment is of a rectangular form, and the sensor element 508 (see FIG. 5*b*), the electronic signal processing component 510 and the electrically conducting contacts 530 are arranged on a side area 534 of the sensor housing 502 that is located alongside the fluidic connection area 516 of the sensor housing 502. The side area 534 forms an outer main area alongside the fluidic connection area 516.

In FIG. 5*a* there can be seen the side area 534 of the sensor housing 502 on which the sensor element 508, the electronic signal processing component 510, the electrical conductor tracks (not depicted here) and the electrically conducting contacts 530, which are formed here as contact pads, are arranged. The electronic signal processing component 510 may be soldered on the sensor housing 502. Furthermore, the hydraulic pressure sensor 500 has on the fluidic connection area 516 a connector 550, by which the hydraulic pressure sensor 500 can be fastened on an HCU by clinching.

FIG. 5*b* shows the embodiment of FIG. 5*a* in a longitudinal section along the line A-A. As can be seen in FIG. 5*b*, the sensor element 508 is arranged underneath the electronic signal processing component 510, that is to say arranged lying between the sensor housing 502 or the diaphragm 506 and the electronic signal processing component 510, so that the sensor element 508 is protected.

As can also be seen in FIG. 5*b*, in the case of the embodiment shown in FIGS. 5*a* and 5*b* a simple contact spring 542 without a housing may be used for the contacting of the ECU instead of the contact spring 342, which is fastened in the housing 340.

In the case of the embodiments shown in FIG. 1 to FIG. 4, the electrically conducting contacts on the sensor housing are arranged parallel to the printed circuit board of the ECU to which the electrically conducting contacts are to be connected. For this reason, contact elements such as contact springs that are arranged at right angles to the electrically conducting contacts are necessary for the electrical contacting. This is possible for example by means of the contact springs arranged in the housing that extend at right angles to the electrically conducting contacts and to the printed circuit board of the ECU.

In the case of the embodiment shown in FIGS. 5*a* and 5*b*, on the other hand, the electrically conducting contacts 530 on the sensor housing 502 are already arranged at right angles to the printed circuit board of the ECU. This makes possible a simple arrangement by means of the contact spring 542 shown in FIG. 5*b*, which extends parallel to the electrically conducting contacts 530.

Figure 6:
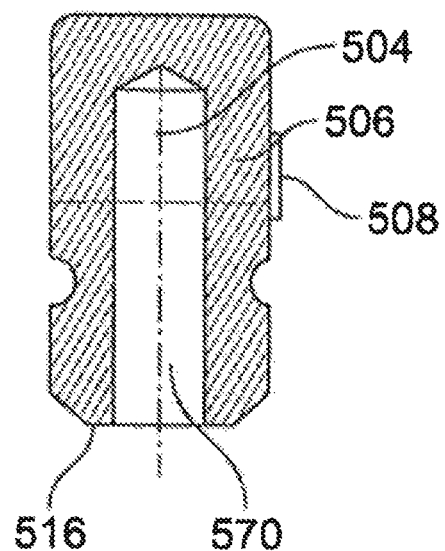
FIG. 6 shows a first configuration of a fluid chamber in the case of the second embodiment shown in FIGS. 5a and 5b.

FIG. 6 shows a first configuration of a fluid chamber 504, as it can be formed in the case of the second embodiment that is shown in FIGS. 5*a* and 5*b*. The sensor housing 502 has a simple hole 570, which forms the fluid chamber 504, and a diaphragm 506 adjoining the fluid chamber 504. The simple hole 570 is formed open to the fluidic connection area 516. Provided on the side of the diaphragm 506 that is facing away from the fluid chamber 504 is a sensor element 508 for measuring the fluid pressure in the fluid chamber 504.

Figure 7:
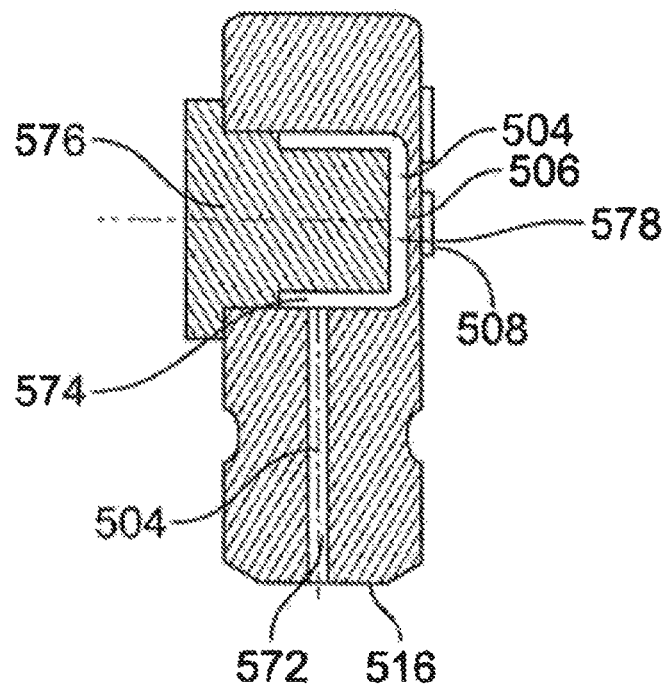
FIG. 7 shows a second configuration of the fluid chamber in the case of the second embodiment shown in FIGS. 5a and 5b.

An embodiment of a fluid chamber 504 in the sensor housing 502 as an alternative to that shown in FIG. 6 can be seen in FIG. 7. Here, the fluid chamber 504 has a feed hole 572, which is open to the fluidic connection area 516 and opens out into a cross hole 574. The cross hole 574 has a greater diameter than the feed hole 572. The cross hole 574 is sealed off from the outside by a plug 576, so that the cross hole 574 still forms a small fluid chamber 578, which adjoins the diaphragm 506.

The embodiments shown above of a hydraulic pressure sensor may be a component part of the hydraulic control unit. The hydraulic control unit may in turn be a component part of a vehicle braking system. The hydraulic control unit with the pressure sensor may form a unit with the electronic control unit, which contacts the electrically conducting contacts of the pressure sensor.

In the case of the embodiments described above, the electronic signal processing component is not arranged on a separate printed circuit board but is integrated in the hydraulic pressure sensor. The electronic signal processing component, the sensor element and the electrically conducting contacts for the contacting of the ECU are arranged on a common main area of the sensor housing, which is either arranged opposite the fluidic connection area with respect to the HCU or alongside the fluidic connection area of the HCU.

The integration of the hydraulic pressure sensor and the electronic signal processing component to form one component has the advantage that, by dispensing with the separate printed circuit board for the electronic signal processing component, fewer components are required, and consequently costs can be reduced. Furthermore, the integration to form one component allows the interface of the HCU or of the hydraulic pressure sensor with respect to the ECU to be designed more flexibly. The hydraulic pressure sensor with the integrated electronic signal processing component has smaller dimensions than a hydraulic pressure sensor that is connected to a separate electronic signal processing component, so that the installation height of the hydraulic pressure sensor can be reduced.

A further advantage is that the contacting of the electronic signal processing component can be performed by the same company together with the production of the hydraulic pressure sensor, which likewise leads to a reduction of the costs. Finally, the integration to form a single component makes possible the advantage that the mounting of the hydraulic pressure sensor is simplified. The embodiment shown in FIGS. 5a and 5b, in which the electrically conducting contacts are arranged at right angles to the HCU and to the printed circuit board of the ECU, makes possible the use of simple contact springs, and consequently represents a pressure sensor of a particularly simple design and low cost.

The principle and mode of operation of this invention have been explained and illustrated in its preferred embodiment. However, it must be understood that this invention may be practiced otherwise than as specifically explained and illustrated without departing from its spirit or scope.

The invention claimed is:

1. A hydraulic pressure sensor for a vehicle, having
   a sensor housing, which has a fluid chamber;
   a deformable element adjoining the fluid chamber;
   a sensor element for sensing the pressure of a fluid in the fluid chamber, which is arranged on the deformable element on a side of the deformable element that is facing away from the fluid chamber; and
   an electronic signal processing component, which is electrically connected to the sensor element and is intended for processing an electrical signal characteristic of the fluid pressure, wherein electrically conducting contacts for passing on the electrical signal processed by the electronic signal processing component, the electronic signal processing component and the sensor element are arranged on a common outer area of the sensor housing that is part of the outer surface of the sensor housing;
   wherein the sensor housing has a fluidic connection area for fluidically connecting the fluid chamber formed in the sensor housing to a fluid channel of a hydraulic control unit;
   wherein the outer area of the sensor housing on which the electrically conducting contacts are formed is arranged alongside the fluidic connection area of the sensor housing; and
   wherein the fluid chamber is formed by a feed hole which is open to the fluidic connection area and opens out into a cross hole, the cross hole being sealed off from the outside by a plug.

2. The hydraulic pressure sensor according to claim 1, wherein the sensor element is arranged lying between the electronic signal processing component and the fluid chamber formed in the sensor housing.

3. The hydraulic pressure sensor according to claim 1, wherein the outer area of the sensor housing on which the electrically conducting contacts are formed is arranged opposite the fluidic connection area of the sensor housing.

4. The hydraulic pressure sensor according to claim 1, wherein a connector by means of which the sensor housing can be fastened on a hydraulic control unit by clinching is provided on the fluidic connection area.

5. The hydraulic pressure sensor according to claim 1, wherein the sensor element has a pressure-dependent resistance element, which is provided on the element that can be deformed under fluid pressure on the side of the element that is facing away from the fluid chamber.

6. The hydraulic pressure sensor according to claim 1, wherein the electrically conducting contacts are formed as contact pads.

7. A hydraulic control unit having a pressure sensor according to claim 1.

8. A vehicle braking system, which has a hydraulic control unit according to claim 7.

9. A subassembly, which has a hydraulic control unit according to claim 7 and an electronic control unit, wherein the electronic control unit contacts the electrically conducting contacts on the outer area of the sensor housing.

10. A hydraulic pressure sensor for a vehicle, having
    a sensor housing, which has a fluid chamber;
    a deformable element adjoining the fluid chamber;
    a sensor element for sensing the pressure of a fluid in the fluid chamber, which is arranged on a deformable element on the side of the deformable element that is facing away from the fluid chamber; and
    an electronic signal processing component, which is electrically connected to the sensor element and is intended for processing an electrical signal characteristic of the fluid pressure, wherein electrically conducting contacts for passing on the electrical signal processed by the electronic signal processing component, the electronic signal processing component and the sensor element are arranged on a common outer area of the sensor housing that is part of the outer surface of the sensor housing;
    wherein the sensor housing has a fluidic connection area for fluidically connecting the fluid chamber formed in the sensor housing to a fluid channel of a hydraulic control unit; and
    wherein a connector by means of which the sensor housing can be fastened on a hydraulic control unit by clinching is provided on the fluidic connection area.

11. The hydraulic pressure sensor according to claim 10, wherein the sensor element is arranged lying between the electronic signal processing component and the fluid chamber formed in the sensor housing.

12. The hydraulic pressure sensor according to claim 10, wherein the outer area of the sensor housing on which the electrically conducting contacts are formed is arranged opposite the fluidic connection area of the sensor housing.

13. The hydraulic pressure sensor according to claim 10, wherein the outer area of the sensor housing on which the electrically conducting contacts are formed is arranged alongside the fluidic connection area of the sensor housing.

14. The hydraulic pressure sensor according to claim 10, wherein the fluid chamber is formed by a feed hole which is open to the fluidic connection area and opens out into a cross hole, the cross hole being sealed off from the outside by a plug.

15. The hydraulic pressure sensor according to claim 10, wherein the sensor element has a pressure-dependent resistance element, which is provided on the element that can be deformed under fluid pressure on the side of the element that is facing away from the fluid chamber.

16. The hydraulic pressure sensor according to claim 10, wherein the electrically conducting contacts are formed as contact pads.

17. A hydraulic control unit having a pressure sensor according to claim 10.

18. A vehicle braking system, which has a hydraulic control unit according to claim 17.

19. A subassembly, which has a hydraulic control unit according to claim 17 and an electronic control unit, wherein the electronic control unit contacts the electrically conducting contacts on the outer area of the sensor housing.

* * * * *